(12) United States Patent
Sugitani et al.

(10) Patent No.: US 12,028,023 B2
(45) Date of Patent: Jul. 2, 2024

(54) AMPLIFIER

(71) Applicant: MITSUBISHI ELECTRIC CORPORATION, Tokyo (JP)

(72) Inventors: Takumi Sugitani, Tokyo (JP); Masatake Hangai, Tokyo (JP); Shintaro Shinjo, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 455 days.

(21) Appl. No.: 17/381,652

(22) Filed: Jul. 21, 2021

(65) Prior Publication Data

US 2021/0351748 A1 Nov. 11, 2021

Related U.S. Application Data

(63) Continuation of application No. PCT/JP2019/010326, filed on Mar. 13, 2019.

(51) Int. Cl.
*H03F 1/22* (2006.01)
*H03F 1/56* (2006.01)

(52) U.S. Cl.
CPC .............. *H03F 1/22* (2013.01); *H03F 1/565* (2013.01); *H03F 2200/537* (2013.01)

(58) Field of Classification Search
CPC ....... H03F 1/22; H03F 1/565; H03F 2200/537
See application file for complete search history.

(56) References Cited

U.S. PATENT DOCUMENTS

| 9,667,211 B1* | 5/2017 | Wyse ........................ H03F 1/22 |
| 2006/0097811 A1* | 5/2006 | Nakamura ........... H03B 5/1228 |
| | | 331/167 |
| 2010/0264988 A1* | 10/2010 | Huang ...................... H03F 1/26 |
| | | 330/277 |
| 2013/0214863 A1 | 8/2013 | Vidojkovic et al. |
| 2014/0368290 A1 | 12/2014 | Sato |

(Continued)

FOREIGN PATENT DOCUMENTS

| JP | 2006-32579 A | 2/2006 |
| JP | 2010-178148 A | 8/2010 |

(Continued)

OTHER PUBLICATIONS

Sun et al., "A 10.8-GHz CMOS Low-Noise Amplifier Using Parallel-Resonant Inductor," IEEE/MTT-S International Microwave Symposium, IEEE, Jun. 2007, pp. 1795-1798.

(Continued)

*Primary Examiner* — Patricia T Nguyen
(74) *Attorney, Agent, or Firm* — Birch, Stewart, Kolasch & Birch, LLP

(57) ABSTRACT

Provided is an amplifier including: a first transistor connected to a signal input terminal; a second transistor connected to a signal output terminal; a wiring line configured to connect the first transistor and the second transistor to each other; and a variable inductor circuit which is electrically connected to the wiring line, and is grounded via a capacitor for DC current interruption, wherein the inductance value of the variable inductor circuit is set to an inductance value for canceling a parasitic capacitance between the first transistor and the second transistor.

18 Claims, 5 Drawing Sheets

(56) References Cited

U.S. PATENT DOCUMENTS

| | | | |
|---|---|---|---|
| 2015/0288334 A1* | 10/2015 | Cai | H03F 3/21 |
| | | | 330/252 |
| 2016/0233843 A1* | 8/2016 | Chan | H03F 3/193 |
| 2017/0366140 A1* | 12/2017 | Jin | H03F 1/223 |
| 2020/0091955 A1* | 3/2020 | Wang | H03F 3/195 |
| 2021/0226595 A1* | 7/2021 | Enomoto | H03F 1/0227 |
| 2022/0021363 A1* | 1/2022 | Cui | H03F 3/193 |

FOREIGN PATENT DOCUMENTS

| | | | |
|---|---|---|---|
| JP | 2011-55144 A | 3/2011 | |
| JP | 2015-2398 A | 1/2015 | |

OTHER PUBLICATIONS

Extended European Search Report for European Application No. 19918680.0, dated Jan. 12, 2022.

* cited by examiner

AMPLIFIER

CROSS REFERENCE TO RELATED APPLICATIONS

This application is a Continuation of PCT International Application No. PCT/JP2019/010326 filed on Mar. 13, 2019, which is hereby expressly incorporated by reference into the present application.

TECHNICAL FIELD

The present invention relates to an amplifier including a plurality of transistors.

BACKGROUND ART

Related-art single-stage single-transistor low noise amplifiers (hereinafter each abbreviated as "LNA") are formed of heterojunction bipolar transistors (hereinafter each abbreviated as "HBT") and field effect transistors (hereinafter each abbreviated as "FET"). For example, an LNA having a cascode configuration using two HBTs made of silicon germanium (SiGe) has a higher gain than that of a single-stage single-transistor grounded emitter circuit. However, this LNA has had a problem of bad noise performance.

In the LNA described in Non Patent Literature 1 below, in order to improve the noise performance of the cascode circuit formed of two transistors in a single stage, an inductor is connected in shunt between the two transistors.

CITATION LIST

Non Patent Literature

[NPL 1] Kuo-Jung Sun and three others, "A 10.8-GHz CMOS Low-Noise Amplifier Using Parallel-Resonant Inductor," 2007 IEEE/MTT-S International Microwave Symposium, IEEE, June 2007, pp. 1795-1798

SUMMARY OF INVENTION

Technical Problem

As described above, in the related-art LNA described in Non Patent Literature 1, the inductor for use to cancel a parasitic capacitance is connected in shunt between the transistors of the cascode circuit. However, in general, semiconductor products have process variations at the time of manufacture, such as quality variations among wafers and quality variations depending on a cut-out position on the same wafer. The parasitic capacitance is affected by those process variations. Accordingly, when an inductor having a fixed inductance is used to cancel the parasitic capacitance as in the related-art LNA of Non Patent Literature 1, the effects of the process variations cannot be sufficiently compensated for. As a result, the related-art LNA has had bad process-variation tolerance of noise performance and a problem in broadband performance.

The present invention has been made to solve the above-mentioned problems, and has an object to provide an amplifier capable of improving process-variation tolerance of noise performance.

Solution to Problem

According to one embodiment of the present invention, there is provided an amplifier including: a first transistor connected to a signal input terminal to which an input signal is to be input; a second transistor connected to a signal output terminal from which an output signal is to be output; a wiring line configured to cascade-connect the first transistor and the second transistor to each other; and a variable inductor circuit which is electrically connected to the wiring line, has an inductance value that is variable, and is grounded via a capacitor for DC current interruption, wherein the inductance value of the variable inductor circuit is set to an inductance value for canceling a parasitic capacitance between the first transistor and the second transistor.

According to the present invention, the amplifier improved in process-variation tolerance of noise performance can be obtained.

DESCRIPTION OF EMBODIMENTS

First Embodiment

Figure 1:
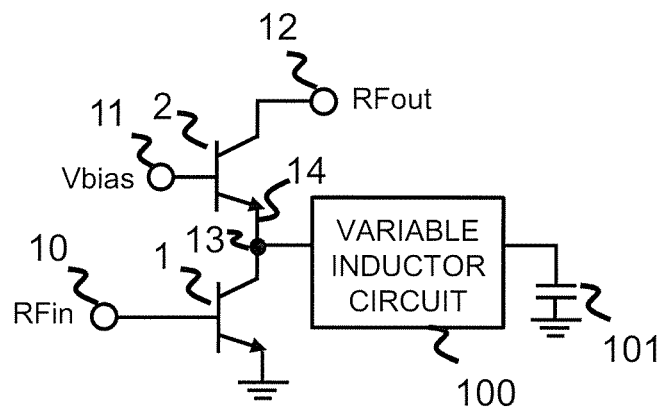
FIG. 1 is a configuration diagram for illustrating a configuration of an amplifier according to a first embodiment of the present invention.

FIG. 1 is a configuration diagram for illustrating a configuration of an amplifier according to a first embodiment of the present invention. In FIG. 1, a low noise amplifier is given and described as an example of the amplifier. As illustrated in FIG. 1, the amplifier includes a first transistor 1, a second transistor 2, a high-frequency signal input terminal 10, a base voltage supply terminal 11, a high-frequency signal output terminal 12, a variable inductor circuit 100, and a capacitor 101.

Each of the first transistor 1 and the second transistor 2 may be formed of a bipolar transistor, for example, an HBT, or may be formed of a field effect transistor, for example, an FET. Description is given here of an example of a case in which each of the first transistor 1 and the second transistor 2 is formed of an HBT. Accordingly, the first transistor 1 and the second transistor 2 each include, as three terminals, an emitter terminal, a collector terminal, and a base terminal. When each of the first transistor 1 and the second transistor 2 is formed of a field effect transistor, in the following descriptions of the first embodiment and a second embodiment, the three terminals of each of the first transistor 1 and the second transistor 2, that is, the emitter terminal, the collector terminal, and the base terminal are read as a source terminal, a drain terminal, and a gate terminal, respectively.

The first transistor 1 forms a cascode circuit. The high-frequency signal input terminal 10 is connected to the base terminal of the first transistor 1. An input signal RFin is input to the high-frequency signal input terminal 10. Further, the emitter terminal of the first transistor 1 is grounded. Further, the collector terminal of the first transistor 1 is connected to the emitter terminal of the second transistor 2. Accordingly, the first transistor 1 and the second transistor 2 are cascade-connected to each other.

The second transistor 2 forms a cascode circuit. The base voltage supply terminal 11 is connected to the base terminal of the second transistor 2. A base voltage Vbias is supplied to the base voltage supply terminal 11. Further, the emitter terminal of the second transistor 2 is connected to the collector terminal of the first transistor 1. Further, the collector terminal of the second transistor 2 is connected to the high-frequency signal output terminal 12. An output signal RFout is output from the high-frequency signal output terminal 12.

A wiring line 14 connects the collector terminal of the first transistor 1 and the emitter terminal of the second transistor 2 to each other.

The variable inductor circuit 100 is connected in shunt to the wiring line 14. In the following, a node between the variable inductor circuit 100 and the wiring line 14 is referred to as "node 13." The variable inductor circuit 100 is electrically connected between the node 13 and the capacitor 101. An inductance value Leff of the variable inductor circuit 100 is variable. The variable inductor circuit 100 is formed of, for example, a metal pattern formed on a semi-conductor substrate. The metal pattern may be achieved by a multilayer wiring line.

The capacitor 101 is provided as a capacitor for DC current interruption. The capacitor 101 has one end connected to the variable inductor circuit 100, and the other end grounded.

Next, an operation of the amplifier according to the first embodiment of the present invention is described.

As described above, the first transistor 1 and the second transistor 2 form a cascode circuit. The first transistor 1 and the second transistor 2 are cascade-connected to each other via the wiring line 14.

At this time, a noise figure F of the cascode circuit can be expressed by the following expression (1).

$$F = F_1 + 4R_s\gamma_3 g_{do3}\left(\frac{\omega_0^2}{\omega_T^2}\right)\left(\frac{C_x^2}{g_{m3}^2}\omega_0^2\right) \quad (1)$$

In the expression, $F_1$ in the first term of the expression (1) represents the noise figure of the first transistor 1. Further, in the second term of the expression (1), Cx represents a sum of parasitic capacitances between the collector (drain) and the emitter (source) of the first transistor 1, between the collector (drain) and the substrate, and between the base (gate) and the emitter (source) of the second transistor 2, $\omega_0$ represents a resonance frequency on the input side, $\omega_T$ represents a cut-off frequency of the transistor 1, Rs represents a source (emitter) impedance, $\gamma_3$ represents a bias-dependent parameter of the transistor 2, $g_{do3}$ represents a zero-bias drain conductance of the transistor 2, and $g_{m3}$ represents a transfer conductance (transconductance) of the transistor 2. As understood from the expression (1), in the noise figure F of the cascode circuit, when the parasitic capacitance Cx can be canceled, the second term becomes zero. As a result, the noise figure F is improved. Canceling the parasitic capacitance Cx to reduce the noise figure F is effective to improve the noise figure F particularly in the case of a high frequency.

As described above, when the parasitic capacitance Cx applied between the two transistors forming the cascode circuit can be canceled, an effect of improving the noise figure F of the cascode circuit can be obtained.

Accordingly, in the first embodiment, the variable inductor circuit 100 is electrically connected to the wiring line 14 connecting between the first transistor 1 and the second transistor 2. The inductance value Leff of the variable inductor circuit 100 is variable. When the inductance value Leff is changed and set to an optimum value, the parasitic capacitance Cx can be canceled.

That is, when the parasitic capacitance Cx can be canceled by adjusting the inductance value Leff of the variable inductor circuit 100, the second term of the expression (1) can be ignored. Accordingly, the value of the noise figure F expressed in the expression (1) is reduced, and thus the noise figure F is improved. Accordingly, in the first embodiment, the inductance value Leff of the variable inductor circuit 100 is adjusted so as to cancel the parasitic capacitance Cx between the two transistors forming the cascode circuit.

Figure 2:
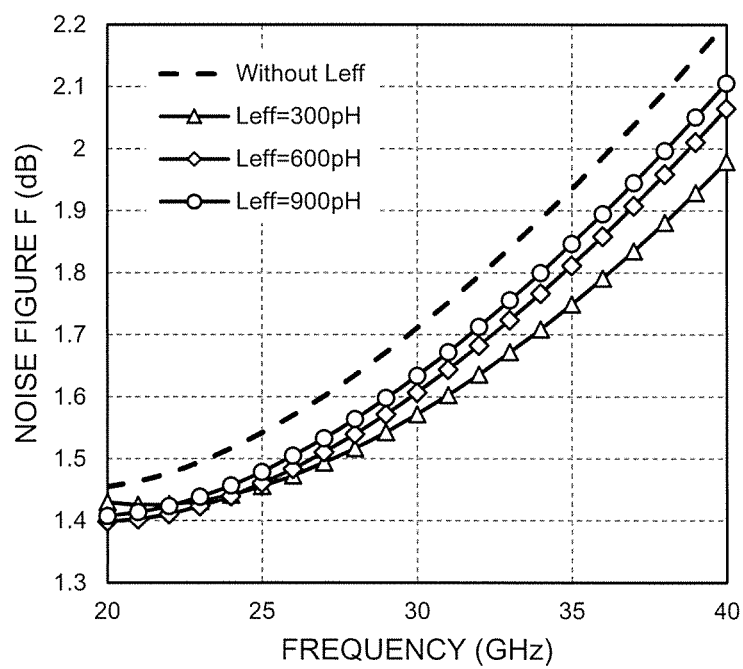
FIG. 2 is a graph for showing simulation results of the amplifier according to the first embodiment of the present invention.

FIG. 2 shows simulation results of the noise figure F at the time when the inductance value Leff of the variable inductor circuit 100 is varied. In the graph of FIG. 2, the horizontal axis represents a frequency of the input signal RFin, and the vertical axis represents the noise figure F. In FIG. 2, a variation range of the inductance value Leff of the variable inductor circuit 100 is set from 300 pH to 900 pH in steps of 300 pH. That is, simulation was performed in each of three cases of a case in which the inductance value Leff was 300 pH, a case in which the inductance value Leff was 600 pH, and a case in which the inductance value Leff was 900 pH. In the simulation results of FIG. 2, a case in which the variable inductor circuit 100 is not used is also shown. Specifically, in FIG. 2, the broken line indicates a relationship between the frequency and the noise figure F of the case in which the variable inductor circuit 100 is not used. Further, plots of "A" and the solid line connecting the plots to each other indicate a relationship between the frequency and the noise figure F of the case in which the inductance value Leff is 300 pH. Further, plots of "0" and the solid line connecting the plots to each other indicate a relationship between the frequency and the noise figure F of the case in which the inductance value Leff is 600 pH. Further, plots of "o" and the solid line connecting the plots to each other indicate a relationship between the frequency and the noise figure F of the case in which the inductance value Leff is 900 pH.

As seen from the simulation results of FIG. 2, for example, the noise figure F at the frequency of 30 GHz in the case in which the variable inductor circuit 100 is not used, which is indicated by the broken line, is F=1.7 dB. Meanwhile, the noise figure F at the frequency of 30 GHz in the case in which the inductance value Leff is 600 pH is F=1.6 dB. As described above, it is understood that, as compared to the case in which the variable inductor circuit 100 is not used, the case in which the inductance value Leff is 600 pH is improved in the noise figure F by about 0.1 dB at the frequency of 30 GHz.

Further, through use of the variable inductor circuit 100, as shown in the simulation results of FIG. 2, the noise figure F is best in the case in which the inductance value Leff is 600 pH at the frequency of 20 GHz, and is best in the case in which the inductance value Leff is 300 pH at the frequency of 40 GHz. As described above, in the first embodiment, the amplifier has a frequency adjustment function to be implemented by the variable inductor circuit 100, thereby being capable of achieving a low noise amplifier having excellent broadband performance.

Figure 3:
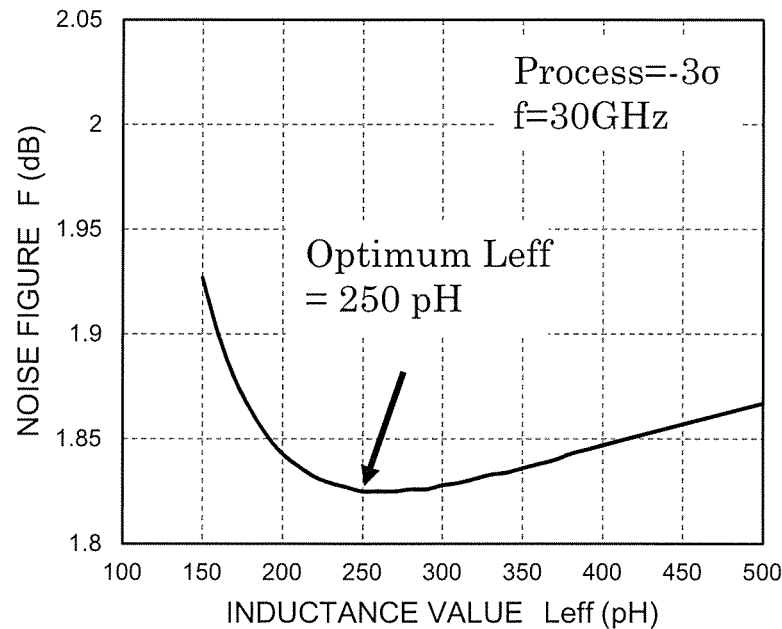
FIG. 3 is a graph for showing simulation results of the amplifier according to the first embodiment of the present invention.
Figure 4:
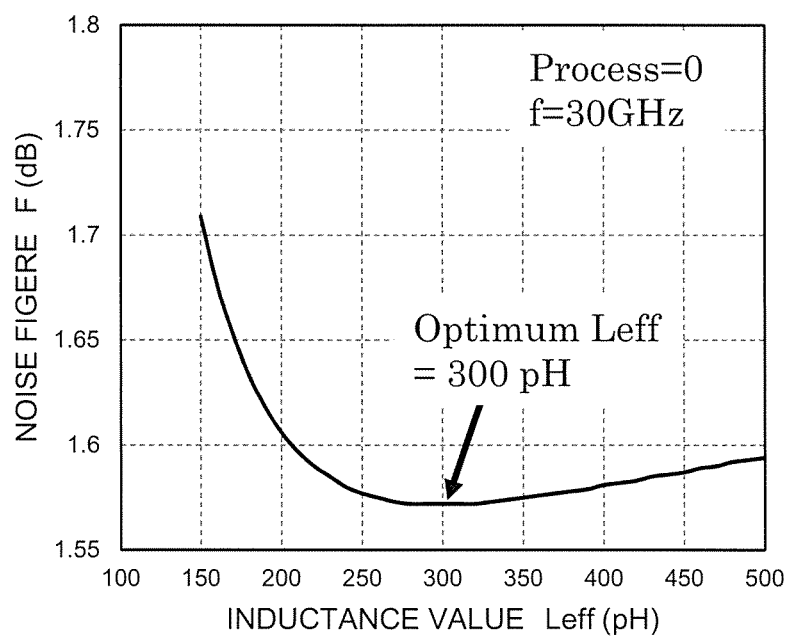
FIG. 4 is a graph for showing simulation results of the amplifier according to the first embodiment of the present invention.
Figure 5:
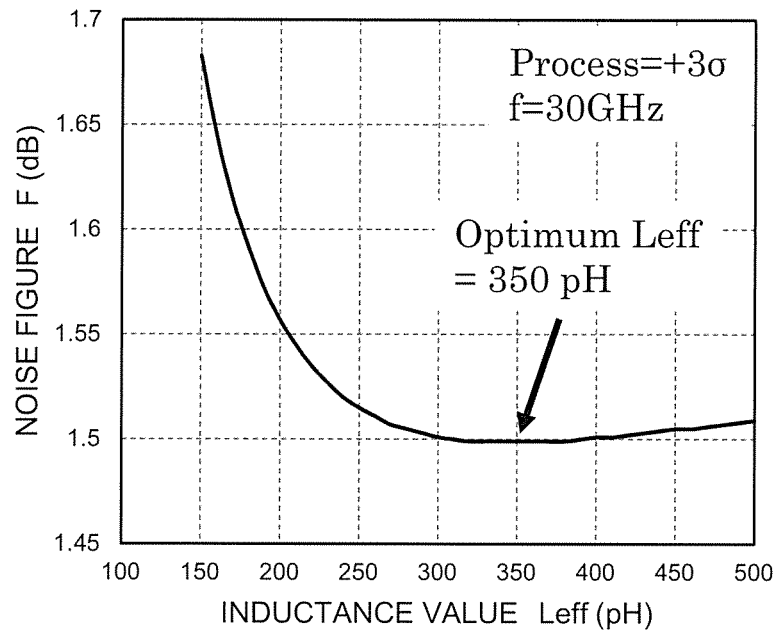
FIG. 5 is a graph for showing simulation results of the amplifier according to the first embodiment of the present invention.

The parasitic capacitance Cx changes depending on process variations of the first transistor 1 and the second transistor 2. Accordingly, the optimum inductance value Leff for canceling the parasitic capacitance Cx changes depending on the process variations. FIG. 3 to FIG. 5 show simulation results of the noise figure F with respect to the inductance value Leff at the time when the process variations at the frequency of 30 GHz are varied by ±3σ. In this case, "σ" represents a standard deviation indicating the process variations. In considering the process variations, the process balance includes lot-to-lot variations, wafer-to-wafer variations, chip-to-chip variations, and within-chip variations. The lot-to-lot variations represent variations between different lots. The wafer-to-wafer variations represent variations between wafers in the same lot. The chip-to-chip variations represent variations between different chips in one wafer. In transistors, variations in threshold voltage or variations in gate length (emitter width) cause variations in current characteristic of the transistor, and in wiring lines, variations in line width, interlayer film thickness, and wiring density of the wiring line cause variations in wiring resistance value or capacitance between wiring lines. In order to check those process variations, a test circuit called a test element group (TEG) is arranged in a wafer surface to check the quality of the process. The standard deviation σ is obtained by measuring, in the case of transistors, the current characteristic of the TEG and the like, and in the case of wiring lines, the line width, the interlayer film thickness, and the wiring density of the wiring line. FIG. 3 shows a case in which the process variations are −3σ. Further, FIG. 4 shows a case in which the process variations are 0. Further, FIG. 5 shows a case in which the process variations are +3σ. Further, in FIG. 3 to FIG. 5, the horizontal axis represents the inductance value Leff of the variable inductor circuit 100, and the vertical axis represents the noise figure F.

The following matters are understood from the simulation results of FIG. 3 to FIG. 5.

First, in the case in which the process variations are +3σ, as shown in FIG. 5, the noise figure F is minimum when the inductance value Leff is 350 pH. Accordingly, in the case in which the process variations are +3σ, the optimum inductance value ("Optimum Leff") at the frequency of 30 GHz is 350 pH.

Further, in the case in which the process variations are −3σ, as shown in FIG. 3, the noise figure F is minimum when the inductance value Leff is 250 pH. Accordingly, in the case in which the process variations are −3σ, the optimum inductance value ("Optimum Leff") at the frequency of 30 GHz is 250 pH.

Further, in the case in which the process variations are 0, as shown in FIG. 4, the noise figure F is minimum when the inductance value Leff is 300 pH. Accordingly, in the case in which the process variations are 0, the optimum inductance value ("Optimum Leff") at the frequency of 30 GHz is 300 pH.

Accordingly, when the inductance value Leff of the variable inductor circuit 100 is set to be variable in a range of from 250 pH to 350 pH, a low noise amplifier having strong process-variation tolerance can be obtained.

A method of adjusting the inductance value Leff of the variable inductor circuit 100 is, for example, as follows. First, the optimum inductance values for each frequency and each process variation are obtained in advance based on the simulation results shown in FIG. 3 to FIG. 5, and the optimum inductance values are stored as a data table. Next, process variations "a×σ" and process variations "b×σ" of the first transistor 1 and the second transistor 2, respectively, which are mounted on the amplifier are calculated from the measurement data. In this case, "σ" and "b" are real numbers. Next, the optimum inductance value is uniquely obtained from the data table based on the value of the frequency and the calculated process variations "a×σ" and "b×σ". Next, the optimum inductance value is set as the inductance value Leff of the variable inductor circuit 100. As a setting method, for example, an operator manually sets the inductance value.

In the first embodiment, detailed description has been given above about the cascode circuit formed of two transistors in a single stage, but the present invention is not limited to this specific embodiment. Various modifications and changes can be made thereto within the range of the gist of the present invention described in the claims. For example, even in a case of a three-stage cascode circuit having a single-stage three-transistor configuration, similar effects can be obtained when a variable inductor circuit is mounted between the transistors.

As described above, in the first embodiment, a plurality of transistors are cascade-connected to each other to form a cascode circuit. Further, the variable inductor circuit 100 is connected between those transistors, and the inductance value Leff of the variable inductor circuit 100 is changed. In this manner, the inductance value Leff is set to an appropriate value to cancel the parasitic capacitance Cx between the transistors of the cascode circuit. In this manner, the noise figure F is improved. The parasitic capacitance Cx is caused by process variations, and hence when the parasitic capacitance Cx is canceled in accordance with the process variations, an amplifier having strong process-variation tolerance can be obtained.

Second Embodiment

Figure 6:
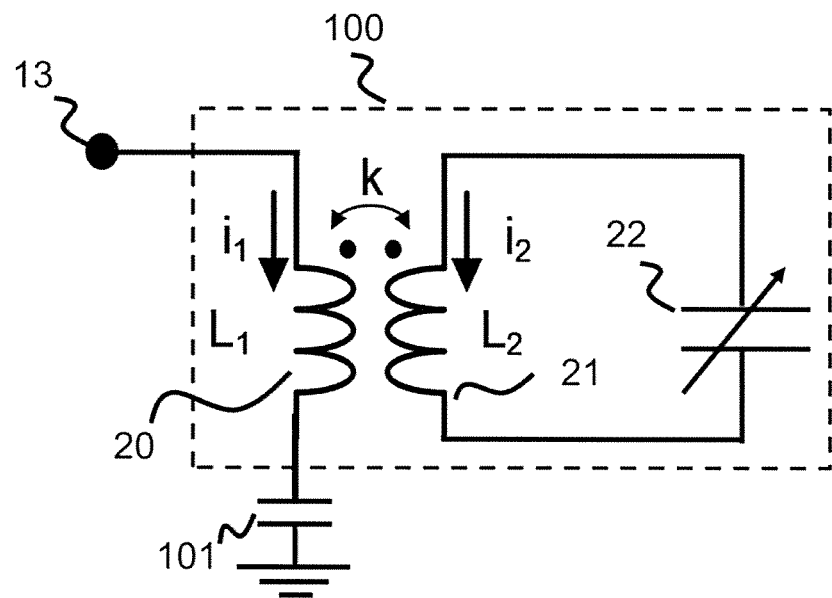
FIG. 6 is a configuration diagram for illustrating a configuration of a variable inductor circuit in a second embodiment of the present invention.

FIG. 6 is a configuration diagram of the variable inductor circuit 100 in a second embodiment of the present invention. In the second embodiment, the configuration of the variable inductor circuit 100 is described.

An overall configuration of an amplifier according to the second embodiment is basically the same as the configuration of FIG. 1 described in the first embodiment. Accordingly, description of configurations other than the variable inductor circuit 100 is omitted here, and only the configuration of the variable inductor circuit 100 is described. Further, also in the second embodiment, similarly to the first embodiment, a low noise amplifier is given and described as an example of the amplifier.

In FIG. 6, the variable inductor circuit 100 is formed of a transformer. The transformer includes a primary-side inductor 20, a secondary-side inductor 21, and a capacitive load 22. The transformer is a device which includes two or more coils wound around one common magnetic core to change an AC voltage and a magnitude of a current by the action of electromagnetic induction. When a current $i_1$ is caused to flow through the primary-side inductor 20, a current $i_2$ flows through the secondary-side inductor 21. Specifically, when the number of turns of a coil of the primary-side inductor 20 is represented by $n_1$ and the number of turns of a coil of the secondary-side inductor 21 is represented by $n_2$, the current $i_1$ and the current $i_2$ have a relationship of "$i_2=(n_1/n_2)\times i_1$" therebetween. The transformer may be formed of a metal pattern formed on a semiconductor substrate.

The primary-side inductor 20 is formed of a coil. As illustrated in FIG. 6, one end of the primary-side inductor 20 is electrically connected to the node 13. The other end of the primary-side inductor 20 is grounded via the capacitor 101.

The secondary-side inductor 21 is formed of a coil. As illustrated in FIG. 6, the secondary-side inductor 21 is arranged so as to be opposed to the primary-side inductor 20. The secondary-side inductor 21 is coupled to the primary-side inductor 20 with a coupling coefficient "k". One end of the secondary-side inductor 21 is connected to a positive terminal of the capacitive load 22, and the other end of the secondary-side inductor 21 is connected to a negative terminal of the capacitive load 22.

The capacitive load 22 is formed of a variable capacitance element. The variable capacitance element is formed of, for example, a diode. A capacitance C of the capacitive load 22 is variable.

Next, an operation of the amplifier according to the second embodiment is described. An input impedance $Z_{in}$ in a case in which the primary side of the variable inductor circuit 100 is set as an input end and the secondary side thereof is connected to a load impedance $Z_L$ can be expressed by the following expression (2).

$$Z_{in} = \frac{\omega^2 M^2 - \omega^2 L_1 L_2 + j\omega L_1 Z_L}{j\omega L_2 + Z_L} \quad (2)$$

$$M = k\sqrt{L_1 L_2}$$

In this expression, $L_1$ represents an inductance of the primary-side inductor 20, $L_2$ represents an inductance of the secondary-side inductor 21, "$\omega$" represents each frequency, and "k" represents the coupling coefficient of the transformer.

From the expression (2), the input impedance $Z_{in}$ and the inductance Leff in a case in which the capacitive load 22 is connected as the load to be connected to the secondary side are expressed by the following expression (3).

$$Z_{in} = j\omega L_1 \left(1 + \frac{\omega^2 k^2 L_2 C}{1 - \omega^2 L_2 C}\right) \quad (3)$$

$$L_{eff} = L_1 \left(1 + \frac{\omega^2 k^2 L_2 C}{1 - \omega^2 L_2 C}\right)$$

In this expression, C represents a capacitance of the capacitive load 22.

Further, consideration is given of a case in which parasitic resistances in the primary-side inductor 20 and the secondary-side inductor 21 are taken into account. The input impedance $Z_{in}$ and the inductance Leff at this time can be expressed by the following expression (4).

$$Z_{in} = r_1 + \frac{\omega^4 C^2 k^2 L_1 L_2 r_2}{1 - \omega^2 C(2L_2 - \omega^2 L_2^2 C - C r_2^2)} + \quad (4)$$

$$j\omega L_1 \left(1 + \frac{\omega^2 C k^2 L_2 (1 - \omega^2 C L_2)}{1 - \omega^2 C(2L_2 - \omega^2 L_2^2 C - C r_2^2)}\right)$$

-continued
$$L_{eff} = L_1 \left(1 + \frac{\omega^2 C k^2 L_2 (1 - \omega^2 C L_2)}{1 - \omega^2 C(2L_2 - \omega^2 L_2^2 C - C r_2^2)}\right)$$

In this expression, $r_1$ represents a parasitic resistance of the primary-side inductor 20, and $r_2$ represents a parasitic resistance of the secondary-side inductor 21.

Figure 7:
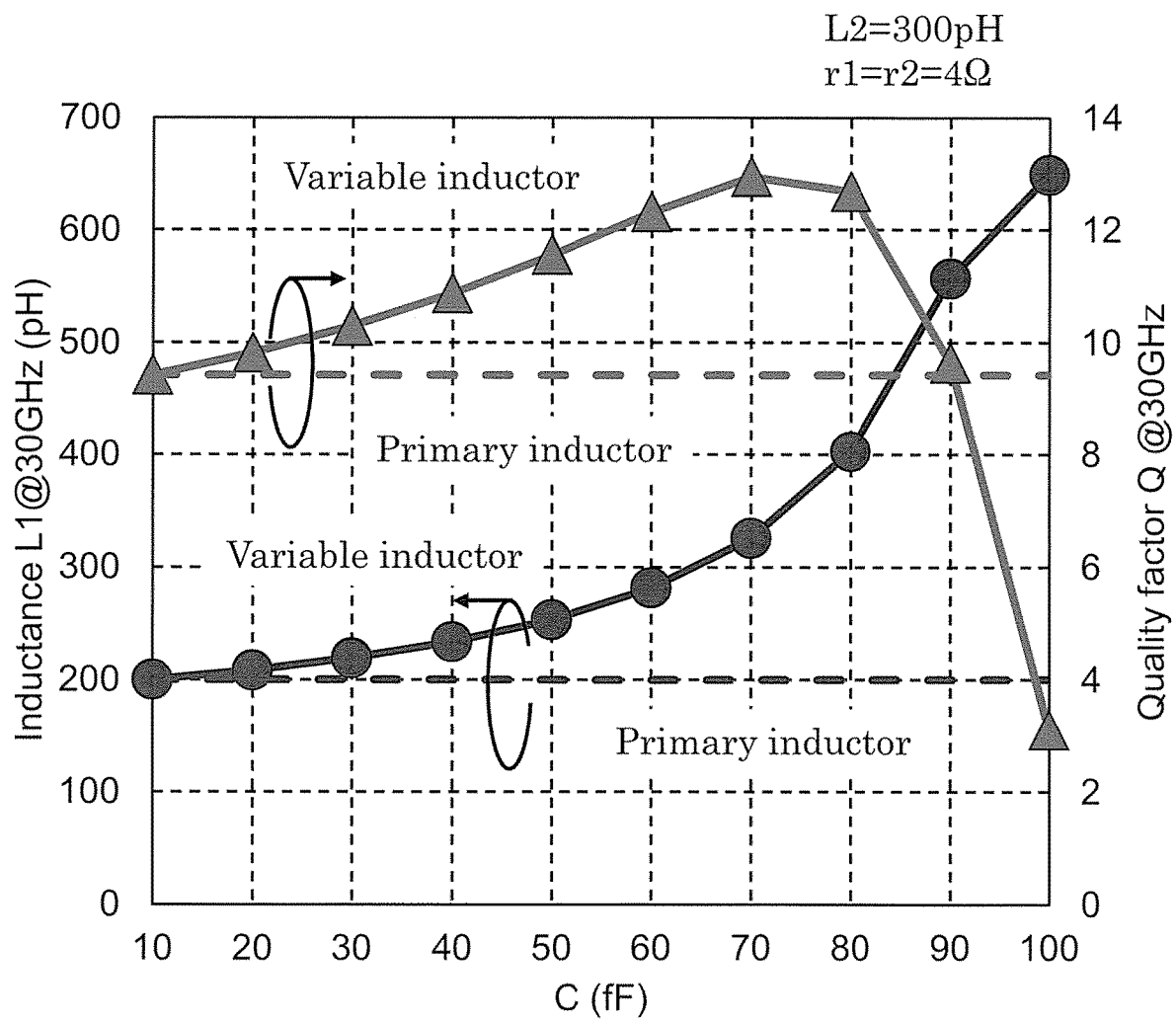
FIG. 7 is a graph for showing simulation results of an amplifier according to the second embodiment of the present invention.

FIG. 7 shows simulation results of the inductance and a quality factor (Q factor) at the time when the capacitance C of the capacitive load 22 of the expression (4) is varied. In FIG. 7, the horizontal axis represents the capacitance C of the capacitive load 22, and the vertical axis represents each of the inductance and the Q factor of the primary-side inductor 20. Further, plots of "●" and the solid line connecting the plots to each other indicate the inductance, and plots of "▲" and the solid line connecting the plots to each other indicate the Q factor. Further, calculation conditions of the simulation were as follows: a frequency was 30 GHz; an initial value of the inductance $L_1$ of the primary-side inductor 20 was 200 pH; the inductance $L_2$ of the secondary-side inductor 21 was fixed to 300 pH; the coupling coefficient "k" of the transformer was 0.6; and each of the parasitic resistance $r_1$ of the primary-side inductor 20 and the parasitic resistance $r_2$ of the secondary-side inductor 21 was 4Ω.

It is understood that, when the capacitive load 22 is connected to the secondary-side inductor 21, along with the increase of the capacitance C, the inductance $L_1$ of the primary-side inductor 20 can be increased as compared to the initial value of the inductance $L_1$ of 200 pH. Further, it is understood that, as compared to the initial value of the Q factor of the inductance $L_1$, a higher Q factor can be obtained in a range in which the capacitance C of the capacitive load 22 is from 10 fF to 90 fF. That is, when the broken line of FIG. 7 is set as a threshold value with respect to the Q factor, in the range in which the capacitance C of the capacitive load 22 is from 10 fF to 90 fF, the Q factor is equal to or larger than the threshold value. In this case, the threshold value is set to 9.5. It is understood that, as seen from the simulation results of FIG. 7, for example, when the initial value of the inductance $L_1$ of the primary-side inductor 20, the inductance $L_2$ of the secondary-side inductor 21, and the capacitance C of the capacitive load 22 to be connected to the secondary-side inductor 21 are set to 200 pH, 300 pH, and 60 fF, respectively, the inductance $L_1$ seen from the primary side is 300 pH which is increased from the initial value of 200 pH by about 100 pH, and the Q factor is improved from the initial value of 9.5 by about 3. Further, under a state in which the secondary side is opened, the circuit has only the primary-side inductance $L_1$, and hence the inductance Leff of the circuit is equal to the primary-side inductance $L_1$.

As described above, in the second embodiment, it is understood that a high Q factor can be obtained when the capacitance C of the capacitive load 22 is adjusted in a range of from 10 fF to 90 fF. Accordingly, in the second embodiment, the value of the current $i_1$ to be caused to flow through the primary-side inductor 20 is controlled so that the capacitance C of the capacitive load 22 falls within the range of from 10 fF to 90 fF.

Figure 8:
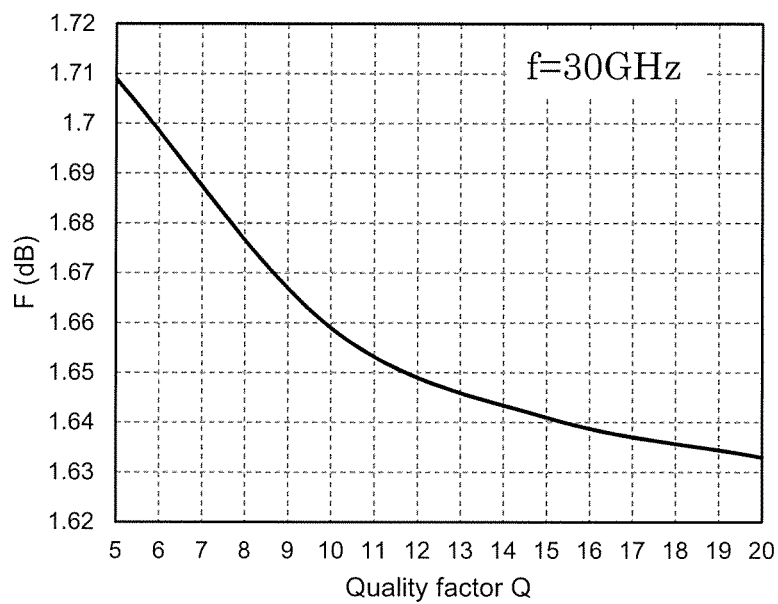
FIG. 8 is a graph for showing simulation results of the amplifier according to the second embodiment of the present invention.

Next, description is given of results obtained by verifying effects caused on the noise figure F by the improvement of the Q factor. FIG. 8 shows simulation results at the time when the inductance value Leff of the variable inductor circuit 100 is fixed to 300 pH, and the Q factor is varied at the frequency of 30 GHz. In FIG. 8, the horizontal axis represents the Q factor, and the vertical axis represents the noise figure F. The Q factor of the variable inductor circuit 100 is changed from 5 to 20. It is understood from the simulation results of FIG. 8 that the noise figure F can be improved by increasing and improving the Q factor of the variable inductor circuit 100.

As described above, according to the amplifier of the second embodiment, the variable inductor circuit 100 using the transformer is used to adjust the capacitance C of the capacitive load 22, thereby being capable of achieving the optimum inductance value Leff for canceling the parasitic capacitance Cx caused along with the process variations. Further, a higher Q factor than that at the initial inductance can be obtained, and thus a low noise amplifier having strong process-variation tolerance and more excellent noise performance can be provided.

In the second embodiment of the present invention, detailed description has been given above about the variable inductor circuit formed of the transformer and the variable capacitance element, but the present invention is not limited to this specific embodiment, and various modifications and changes can be made thereto within the range of the gist of the present invention described in the claims.

In the above-mentioned first and second embodiments, the inductance value Leff for canceling the parasitic capacitance Cx between the first transistor 1 and the second transistor 2 is described as the "optimum inductance value (Optimum Leff)." However, the inductance value is not always required to be "optimum." That is, the inductance value is only required to be adjusted in the direction of canceling the parasitic capacitance Cx between the first transistor 1 and the second transistor 2, and the above-mentioned effects of the subject application are obtained in this case.

REFERENCE SIGNS LIST

1 first transistor, 2 second transistor, 10 high-frequency signal input terminal, 11 base voltage supply terminal, 12 high-frequency signal output terminal, 13 node, 14 wiring line, 20 primary-side inductor, 21 secondary-side inductor, 22 capacitive load, 100 a variable inductor circuit, 101 capacitor

The invention claimed is:

1. An amplifier, comprising:
   a first transistor connected to a signal input terminal to which an input signal is to be input;
   a second transistor connected to a signal output terminal from which an output signal is to be output;
   a wiring line configured to cascade-connect the first transistor and the second transistor to each other; and
   a variable inductor circuit which is electrically connected to the wiring line, has an inductance value that is variable, and is grounded via a capacitor for DC current interruption,
   wherein the variable inductor circuit is configured to
      obtain a plurality of optimum inductance values for each frequency and each process variation of the first transistor and the second transistor in advance,
      obtain the optimum inductance value uniquely from the plurality of optimum inductance values, based on the value of the frequency and the process variation calculated from measurement data, and
      set the inductance value of the variable inductor circuit to the uniquely obtained optimum inductance value.

2. The amplifier according to claim 1, wherein the variable inductor circuit is formed of a metal pattern formed on a semiconductor substrate.

3. The amplifier according to claim 1,
   wherein the variable inductor circuit is formed of a transformer, and
   wherein the transformer includes:
      a primary-side inductor having one end connected to the wiring line, and the other end grounded via the capacitor;
      a secondary-side inductor coupled to the primary-side inductor with a coupling coefficient "k"; and
      a capacitive load which has a positive terminal connected to one end of the secondary-side inductor and a negative terminal connected to the other end of the secondary-side inductor, and is formed of a variable capacitance element.

4. The amplifier according to claim 2,
   wherein the variable inductor circuit is formed of a transformer, and
   wherein the transformer includes:
      a primary-side inductor having one end connected to the wiring line, and the other end grounded via the capacitor;
      a secondary-side inductor coupled to the primary-side inductor with a coupling coefficient "k"; and
      a capacitive load which has a positive terminal connected to one end of the secondary-side inductor and a negative terminal connected to the other end of the secondary-side inductor, and is formed of a variable capacitance element.

5. The amplifier according to claim 3, wherein the variable capacitance element is formed of a diode.

6. The amplifier according to claim 4, wherein the variable capacitance element is formed of a diode.

7. The amplifier according to claim 1,
   wherein each of the first transistor and the second transistor is formed of a bipolar transistor, and
   wherein the wiring line is configured to connect a collector terminal of the first transistor and an emitter terminal of the second transistor to each other.

8. The amplifier according to claim 2,
   wherein each of the first transistor and the second transistor is formed of a bipolar transistor, and
   wherein the wiring line is configured to connect a collector terminal of the first transistor and an emitter terminal of the second transistor to each other.

9. The amplifier according to claim 3,
   wherein each of the first transistor and the second transistor is formed of a bipolar transistor, and
   wherein the wiring line is configured to connect a collector terminal of the first transistor and an emitter terminal of the second transistor to each other.

10. The amplifier according to claim 4,
    wherein each of the first transistor and the second transistor is formed of a bipolar transistor, and
    wherein the wiring line is configured to connect a collector terminal of the first transistor and an emitter terminal of the second transistor to each other.

11. The amplifier according to claim 5,
    wherein each of the first transistor and the second transistor is formed of a bipolar transistor, and
    wherein the wiring line is configured to connect a collector terminal of the first transistor and an emitter terminal of the second transistor to each other.

12. The amplifier according to claim 6,
    wherein each of the first transistor and the second transistor is formed of a bipolar transistor, and wherein the wiring line is configured to connect a collector terminal of the first transistor and an emitter terminal of the second transistor to each other.

13. The amplifier according to claim 1,
wherein each of the first transistor and the second transistor is formed of a field effect transistor, and
wherein the wiring line is configured to connect a drain terminal of the first transistor and a source terminal of the second transistor to each other.

14. The amplifier according to claim 2,
wherein each of the first transistor and the second transistor is formed of a field effect transistor, and
wherein the wiring line is configured to connect a drain terminal of the first transistor and a source terminal of the second transistor to each other.

15. The amplifier according to claim 3,
wherein each of the first transistor and the second transistor is formed of a field effect transistor, and
wherein the wiring line is configured to connect a drain terminal of the first transistor and a source terminal of the second transistor to each other.

16. The amplifier according to claim 4,
wherein each of the first transistor and the second transistor is formed of a field effect transistor, and
wherein the wiring line is configured to connect a drain terminal of the first transistor and a source terminal of the second transistor to each other.

17. The amplifier according to claim 5,
wherein each of the first transistor and the second transistor is formed of a field effect transistor, and
wherein the wiring line is configured to connect a drain terminal of the first transistor and a source terminal of the second transistor to each other.

18. The amplifier according to claim 6,
wherein each of the first transistor and the second transistor is formed of a field effect transistor, and
wherein the wiring line is configured to connect a drain terminal of the first transistor and a source terminal of the second transistor to each other.

* * * * *